(12) United States Patent
Ruengeler et al.

(10) Patent No.: US 10,707,968 B2
(45) Date of Patent: Jul. 7, 2020

(54) FREQUENCY COMB GENERATING DEVICE AND METHOD FOR GENERATING A FREQUENCY COMB

(71) Applicant: Rohde & Schwarz GmbH & Co. KG, Munich (DE)

(72) Inventors: Matthias Ruengeler, Markt Schwaben (DE); Gerhard Roesel, Unterthingau (DE); Jakob Hammer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/135,808

(22) Filed: Sep. 19, 2018

(65) Prior Publication Data

US 2020/0092006 A1    Mar. 19, 2020

(51) Int. Cl.
| | | |
|---|---|---|
| *H04B 10/04* | (2006.01) | |
| *H04B 10/508* | (2013.01) | |
| *G02F 1/35* | (2006.01) | |
| *H01S 3/094* | (2006.01) | |

(52) U.S. Cl.
CPC .......... *H04B 10/508* (2013.01); *G02F 1/353* (2013.01); *H01S 3/094076* (2013.01); *G02F 2203/25* (2013.01)

(58) Field of Classification Search
CPC ... H04B 10/508; G02F 1/353; G02F 2203/25; H01S 3/094076
USPC ........................................................ 398/183
See application file for complete search history.

(56) References Cited

U.S. PATENT DOCUMENTS

| | | | |
|---|---|---|---|
| 4,910,458 A | 3/1990 | Forsyth et al. | |
| 5,270,643 A | 12/1993 | Richardson et al. | |
| 7,492,981 B2 | 2/2009 | Furuyama | |
| 2006/0245765 A1* | 11/2006 | Elahmadi | H04B 10/2513 398/189 |
| 2010/0245967 A1* | 9/2010 | Schimpe | H04B 10/505 359/238 |
| 2018/0058197 A1* | 3/2018 | Barfoot | G01V 8/02 |

* cited by examiner

*Primary Examiner* — Mohammad R Sedighian
(74) *Attorney, Agent, or Firm* — Christensen O'Connor Johnson Kindness PLLC

(57) ABSTRACT

A frequency comb generating device is described. The frequency comb generating device comprises a pulsed optical light source, a sequence generator, a light receiving unit and a switching unit. The sequence generator is configured to generate a repeating sequence signal and to forward the repeating sequence signal at least to the switching unit. The pulsed optical light source is configured to generate electromagnetic wave packets and is synchronized with the sequence generator. The light receiving unit is configured to receive the electromagnetic wave packets and to convert the electromagnetic wave packets into an electrical signal. The switching unit is configured to at least one of control the pulsed optical light source, control the light receiving unit, attenuate the electromagnetic wave packets, phase shift the electromagnetic wave packets, attenuate the electrical signal, and phase shift the electrical signal based on the repeating sequence signal. Moreover, methods for generating an optical frequency comb and for generating an electrical frequency comb are described.

18 Claims, 4 Drawing Sheets

FREQUENCY COMB GENERATING DEVICE AND METHOD FOR GENERATING A FREQUENCY COMB

FIELD OF THE DISCLOSURE

Embodiments of the present disclosure relate generally to a frequency comb generating device, a method for generating an optical frequency comb as well as to a method for generating an electrical frequency comb.

BACKGROUND

Optical or electrical frequency combs consist of a series of essentially equidistant electrical pulses which are approximately shaped as Dirac delta functions. These electrical frequency combs are often used for phase and amplitude calibration of spectrum analyzers or oscilloscopes, wherein the electrical combs serve as a known reference for the calibration process.

For the generation of the reference frequency comb, there are two seemingly contradictory requirements. On one hand, a certain minimum signal-to-noise ratio is required which is linked to a minimum power level of the electrical frequency comb. The power level of the electrical frequency comb in turn is determined by the number of pulses per time interval, e.g. the pulse frequency in time domain. A high power level therefore demands for a high pulse frequency in time domain.

On the other hand, usually a very fine frequency comb is desired, e.g. the frequency interval between peaks in the frequency domain should be very small. This, however, corresponds to a large time interval between peaks in time domain as the intervals in time and frequency domain are inversely proportional to each other. Thus, a fine frequency comb in frequency domain requires a low pulse frequency in time domain.

Therefore, there is a need for a frequency comb generating device as well as a method for generating an optical or an electrical frequency comb that are capable of generating fine frequency combs with a high signal-to-noise ratio.

SUMMARY

Embodiments of the present disclosure provide a frequency comb generating device. The frequency comb generating device comprises a pulsed optical light source, a sequence generator, a light receiving unit and a switching unit. The sequence generator is configured to generate a repeating sequence signal and to forward the repeating sequence signal at least to the switching unit. The pulsed optical light source is configured to generate electromagnetic wave packets. The pulsed optical light source is synchronized with the sequence generator. The light receiving unit is configured to receive the electromagnetic wave packets and to convert the electromagnetic wave packets into an electrical signal. The switching unit is configured to at least one of control the pulsed optical light source, control the light receiving unit, attenuate the electromagnetic wave packets, phase shift the electromagnetic wave packets, attenuate the electrical signal, and phase shift the electrical signal based on the repeating sequence signal.

Through the combination of the pulsed optical light source with the light receiving unit, a high power level is achievable as the individual electromagnetic wave packets can be generated at a high frequency. The switching unit alters the properties of an electrical frequency comb generated by the frequency comb generating device, for example the pulsed optical light source, to the effect that the intervals between the individual Dirac functions in frequency domain are reduced, while still maintaining a high signal-to-noise ratio. Thereby, a fine electrical frequency comb with high signal-to-noise ratio is achieved.

In fact, the electromagnetic wave packets received by the light receiving unit correspond to optical radiation or rather electromagnetic waves in the optical wavelength range, for instance between 100 nm and 1 mm.

Therein and in the following, the term "light" is to be understood to be not restricted to the visible light range, but rather to also include the infrared and ultraviolet frequency ranges.

Moreover, the term "synchronized" means that the frequency at which the pulsed optical light sources generates the electromagnetic wave packets (e.g. the number of wave packets per time interval, not the frequency of the light itself) and the number of pieces of information (contained in the repeating sequence signal) generated per time interval have a predetermined ratio, for example one. Alternatively or additionally, there is a predetermined phase relation between the generation of a wave packet and the generation of a piece of information.

The phase shift of the electromagnetic wave packets and/or the phase shift of the electrical signal corresponds to delaying at least a certain signal portion in time. This becomes obvious since the pulsed optical light source may generate electromagnetic pulses wherein pulses can only be controlled with regard to amplitude and delay (phase).

The switching unit may be assigned to different components of the frequency comb generating device so that the switching unit is enabled to interact with the optical light source directly. Alternatively or additionally, the switching unit is connected to the light receiving unit so as to control the light receiving unit.

Alternatively or additionally, the switching unit is assigned to the optical part of the frequency comb generating device as the switching unit attenuates the electromagnetic wave packets and/or phase shifts the electromagnetic wave packets.

Alternatively or additionally, the switching unit is assigned to the electrical part of the frequency comb generating device as the switching unit attenuates the electrical signal and/or phase shifts the electrical signal.

Generally, the switching unit interacts with the respective component based on the repeating sequence signal generated by the sequence generator.

In other words, based on the repeating sequence signal, the switching unit is configured to control the pulsed optical light source, to control the light receiving unit, to attenuate the electromagnetic wave packets, to phase shift the electromagnetic wave packets, to attenuate the electrical signal, and/or to phase shift the electrical signal. For this purpose, the switching unit is connected with the pulsed optical light source, the light receiving unit, the optical part of the frequency comb generating device and/or the electrical part of the frequency comb generating device.

In one embodiment according to the disclosure, the sequence generator is configured to generate a pseudorandom binary sequence. The binary sequence may correspond to a digital signal. Thus, the individual pieces of information contained within the repeating sequence signal are "0" and "1", or at least can be mapped onto these two values, wherein the order of the individual pieces of information is pseudorandomly generated. After a predefined time interval, the same order may be repeated.

The light receiving unit may be a photo diode. Thus, the electromagnetic wave packets are converted to at least one electrical signal in a particular energy efficient manner and in real time.

In another embodiment according to the disclosure, the pulsed optical light source is an optical pulsed laser. Optical pulsed lasers are capable of generating high intensity electromagnetic wave packets of particularly short duration, thereby optimally approximating a Dirac comb.

According to another aspect, the pulsed optical light source and the light receiving unit are optically connected with each other via an optical fiber. Due to the optical fiber, the pulsed optical light source and the light receiving unit do not need to be perfectly aligned. Thus, intensity losses due to misalignment and/or other perturbations is reduced or even eliminated which in turn simplifies the manufacturing of the frequency comb generating device.

In some embodiments of the disclosure, the switching unit is configured to control the pulsed optical light source to generate an electromagnetic wave packet for at least one certain current value of the repeating sequence signal and to not generate an electromagnetic wave packet for at least one other certain current value of the repeating sequence signal. The current value corresponds to the respective actual value of the repeating sequence signal. The resulting optical frequency comb in time domain is missing some of its teeth compared to a full optical frequency comb, which translates to a shorter distance between the individual Dirac functions in frequency domain. Thus, by cancelling out some of the Dirac functions in time domain (or rather not generating them in the first place), a fine optical frequency comb is achieved, which is then converted to a fine electrical frequency comb by the light receiving unit.

The switching unit may be configured to control the pulsed optical light source to generate an electromagnetic wave packet for each bit of the binary sequence having one value of the two possible values and to not generate an electromagnetic wave packet for each bit having the other value of the two possible values. For example, the switching unit may control the pulsed optical light source to generate an optical pulse for every "1" and to not generate an optical pulse for every "0" in the binary sequence, or vice versa.

According to a further aspect, the switching unit in some embodiments is an electrical switch connected to the light receiving unit, where the switching unit is positioned downstream of the light receiving unit. Hence, the switching unit is assigned to the electrical part of the frequency comb generating device. The switching unit is configured to attenuate and/or phase shift the electrical signals generated by the light receiving unit based on the current value of the repeating sequence signal. For example, the switching unit is configured to cancel out an electrical pulse for at least one value and to not alter the electrical pulse for the other values. By cancelling out some of the electrical pulses, a fine electrical frequency comb is generated, as explained above. For example, the switching unit may be a high-bandwidth electrical switch.

In some embodiments of the disclosure, the switching unit is an optical switch connected to the light receiving unit, where the switching unit is positioned upstream of the light receiving unit. Hence, the switching unit is assigned to the optical part of the frequency comb generating device. The switching unit is configured to attenuate and/or phase shift the electromagnetic wave packets generated by the pulsed optical light source based on the current value of the repeating sequence signal. For example, the switching unit is configured to cancel out an electromagnetic wave packet for at least one value and to not alter the electromagnetic wave packet for the other values. By cancelling out some of the electromagnetic wave packets, a fine optical frequency comb is generated, as explained above. For example, the switching unit may be a high-bandwidth optical switch.

In another embodiment according to the disclosure, the switching unit is configured to control the light receiving unit to convert the received electromagnetic wave packets into an electrical signal with predefined properties, wherein the predefined properties depend on the current value of the repeating sequence signal. Thereby, the resulting electrical frequency comb is altered such that the intervals between the individual Dirac functions in frequency domain are lowered while still maintaining a high signal-to-noise ratio.

The repeating sequence signal may comprise a ternary sequence. Thus, the individual pieces of information are "−1", "0" and "1", or at least the actual value can be mapped onto these three values.

According to an aspect, the switching unit is configured to control the light receiving unit to generate a positive voltage pulse, a negative voltage pulse or no voltage pulse based on the current value of the ternary sequence. The light receiving unit may generate a positive voltage electrical pulse for every "1", a negative voltage electrical pulse for every "−1" and may not generate an electrical pulse for every "0" in the ternary sequence. Of course, any other mapping of current values of the repeating sequence signal onto the properties of the electrical pulses is also possible. Once again, this results in a fine electrical frequency comb with a high signal-to-noise ratio.

According to a further aspect, the light receiving unit is a switchable photo diode comprising two conversion elements. In this embodiment, the switching unit is configured to selectively activate the conversion elements based on the current value of the ternary sequence. For example, one conversion element is configured to generate negative voltage pulse while the other one is configured to generate positive voltage pulses.

In another embodiment, the light receiving unit is a switchable photo diode comprising two conversion elements and a control unit. In this embodiment, the switching unit is configured to forward the repeating sequence signal to the control unit, and the control unit is configured to selectively activate the two conversion elements based on the repeating sequence signal. For example, one conversion element is configured to generate negative voltage pulses while the other one is configured to generate positive voltage pulses.

Embodiments of the present disclosure also provide a method for generating an optical frequency comb, comprising the steps of: generating a repeating sequence signal; and generating optical electromagnetic wave packets; wherein parts of the optical electromagnetic wave packets are filtered out based on the repeating sequence signal or the step of generating the electromagnetic wave packets is controlled based on the repeating sequence signal.

In other words, the optical frequency comb is obtained either by controlling a light source, for example an optical pulsed light source, to directly generate the optical frequency comb, or by generating a full optical frequency comb and cancelling out some of the Dirac functions in time domain, as explained above. The resulting optical frequency comb in time domain is missing some of its teeth compared to a full optical frequency comb, which translates to a shorter distance between the individual Dirac functions in frequency domain. Thus, by cancelling out some of the Dirac functions in time domain (or rather not generating them in the first place), a fine optical frequency comb is achieved. The modified optical frequency comb may then be forwarded to further devices, e.g., for the purpose of calibrating the devices.

Regarding the further advantages, reference is made to the explanations given above.

According to one aspect, the repeating sequence signal comprises a binary or a ternary sequence.

Embodiments of the present disclosure also provide a method for generating an electrical frequency comb, comprising the steps of: generating a repeating sequence signal; generating optical electromagnetic wave packets; receiving the optical electromagnetic wave packets; and converting the optical electromagnetic wave packets into an electrical signal; wherein parts of the optical electromagnetic wave packets or parts of the electrical signal are filtered out based on the repeating sequence signal, or wherein the step of generating the electromagnetic wave packets is controlled based on the repeating sequence signal or the steps of receiving and converting the optical electromagnetic wave packets are controlled based on the repeating sequence signal. Regarding the advantages, reference is made to the explanations given above.

According to one aspect, the repeating sequence signal comprises a binary or a ternary sequence.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Figure 1:
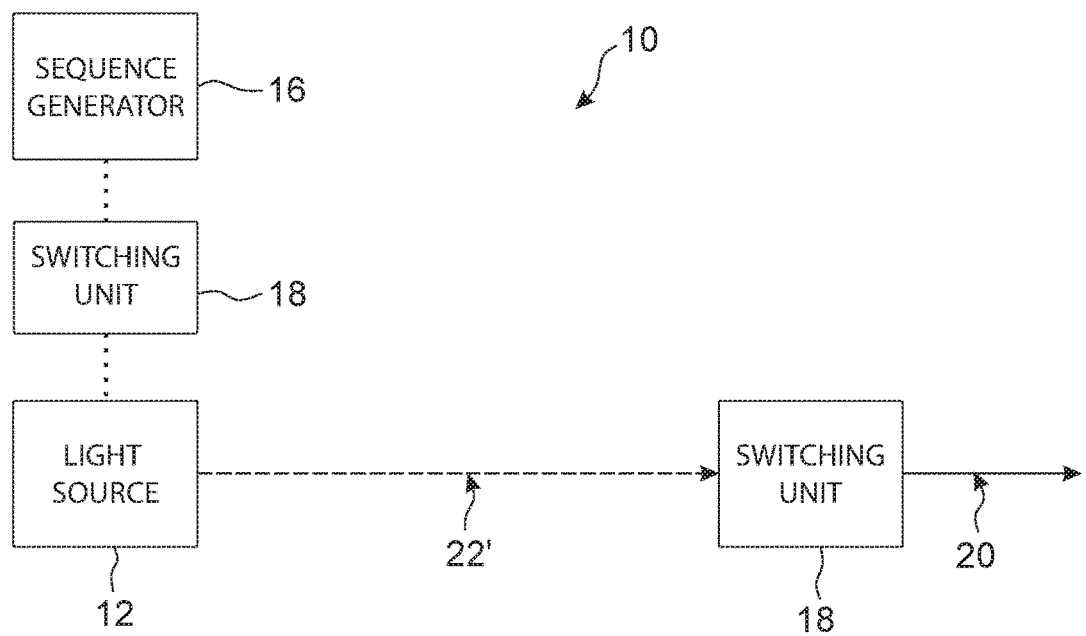
FIG. 1 schematically shows a first representative embodiment of a frequency comb generating device according to the disclosure.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following, the term "light" is to be understood to be not restricted to the visible light range, but rather to also include the infrared and ultraviolet frequency ranges.

FIGS. 1 to 4 schematically show different representative embodiments of a frequency comb generating device 10. In each of the representative embodiments, the frequency comb generating device 10 comprises a pulsed optical light source 12, a light receiving unit 14, a sequence generator 16, and a switching unit 18.

In FIGS. 1 to 4, dotted lines represent a connection that is signal transmitting in an arbitrary way. This may include wired or wireless communication between the individual device functional units, also called components. Dashed lines represent an optical connection, e.g., light may be transported between the different devices over air, through vacuum and/or via one or several optical fibers. Finally, solid lines represent an electrical wire-based connection. When an arrow is attached to a connecting line, it is to be understood that this arrow depicts the travel direction of a corresponding optical signal or electrical signal, respectively.

The sequence generator 16 is configured to generate a repeating sequence signal and to forward the repeating sequence signal to the switching unit 18 to which the sequence generator 16 is connected in a signal transmitting manner.

The repeating sequence may comprise a binary and/or a ternary sequence, which repeats after a predefined time interval, wherein the individual pieces of information are generated with a sequence frequency $f_S$. In other words, the sequence generator 16 generates pieces of information with a frequency $f_S$, wherein each piece of information may have one of two or one of three values, respectively. For example, the repeating sequence may be a pseudorandom binary sequence (PRBS).

The pulsed optical light source 12 is configured to generate electromagnetic wave packets, which will be referred to as optical pulses in the following. The pulsed optical light source 12 generates the optical pulses with a basic pulse frequency $f_p$, which means that the time between two pulses normally is $T_p = 1/f_p$. For example, the optical light source 12 is configured to generate short or ultrashort optical pulses, e.g., the width of the individual pulses is much smaller than the time between two pulses even for high frequencies $f_p$. For example, the optical light source 12 may be an optical pulsed laser.

In time domain, each optical pulse typically has the form of a sinusoid, wherein the maximum amplitude is confined by a Gaussian function. As the individual optical pulses are very short, without restriction of generality each optical pulse will be approximated to have the form of a Dirac function in the following.

The pulsed optical light source 12 is synchronized with the sequence generator 16, which means that the pulse frequency $f_p$ and the sequence frequency $f_s$ have a predefined ratio $n = f_p/f_s$.

In a particular embodiment, the ratio n is equal to 1, which means that the optical pulses and the individual pieces of information contained in the repeating sequence signal are generated with the same frequency.

Moreover, the optical light source 12 and the sequence generator 16 may be synchronized with respect to phase, which means that there is a predetermined time delay interval between the generation of an optical pulse and a corresponding piece of information contained in the repeating sequence signal.

The light receiving unit 14 is configured to receive the electromagnetic wave packets, e.g., the optical pulses, and to convert the optical pulses into a corresponding electrical signal. For example, the light receiving unit 14 is a photo diode.

The functionality of the switching unit 18 at least partly depends on the embodiment, and will be described in more detail in the following for each embodiment of the frequency comb generating device 10 with respect to FIGS. 1 to 4. In the embodiment shown in FIG. 1, the switching unit 18 is configured to control the pulsed optical light source 12 based on the repeating sequence signal generated by the sequence generator 16, more specifically based on the current value of the repeating sequence signal.

In some embodiments, the switching unit 18 may be separate from the sequence generator 16 and the pulsed optical light source 12. Alternatively, the switching unit 18 may be integrated into the sequence generator 16 or into the pulsed optical light source 12. In some embodiments, the pulsed optical light source 12, the sequence generator 16 and/or the switching unit 18 may be formed integrally with each other so that the respective components are housed in a common housing.

Figure 5:
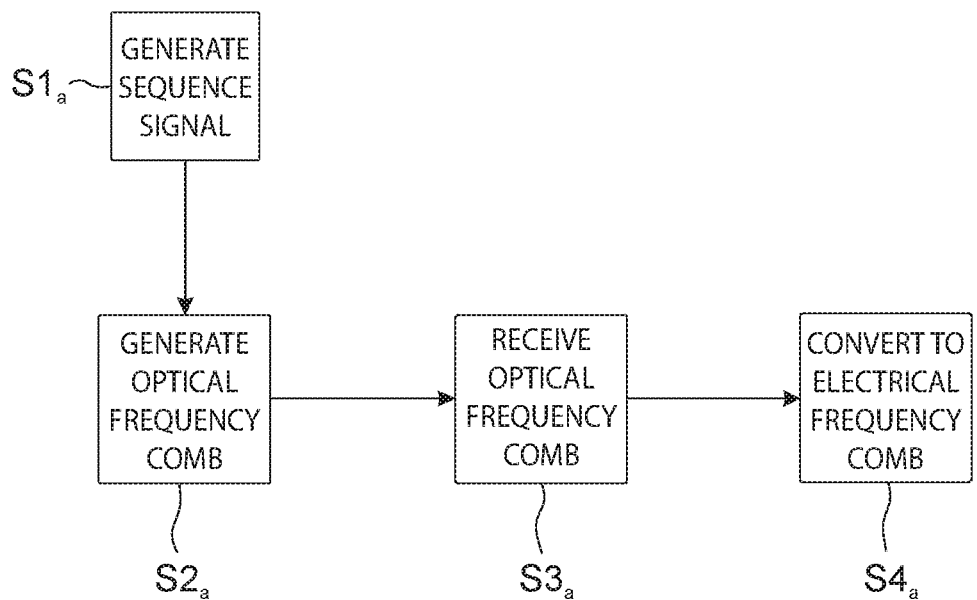
FIG. 5 schematically shows a flowchart of a first representative embodiment of a method for generating an electrical frequency comb according to the disclosure.

In the embodiment of FIG. 1, an electrical frequency comb 20 with known characteristics is generated as explained in the following with reference to FIGS. 1 and 5. First, the repeating sequence signal is generated via the sequence generator as described above (step S1$_a$).

The switching unit 18 controls the pulsed optical light source 12 to generate an optical pulse every time the current piece of information contained in the repeating sequence signal is equal to at least one of the possible values and to not generate an optical pulse when the current piece of information contained in the repeating sequence signal is equal to one of the other possible values (step S2$_a$).

For example, if the repeating sequence is a binary sequence, the possible individual pieces of information are "0" and "1". In this case, the switching unit 18 may control the pulsed optical light source 12 to generate an optical pulse for every "1" and to not generate an optical pulse for every "0" in the binary sequence, or vice versa.

Without any additional control, the pulsed optical light source 12 would generate optical pulses at a frequency $f_p$ which would result in an optical frequency comb 22 with a spacing of $f_p$ of the individual Dirac functions in the frequency domain.

The result of step S2$_a$, however, is a modified optical frequency comb 22' with a spacing between the individual Dirac functions that is much smaller than $f_p$ and that has a high signal-to-noise ratio.

The modified optical frequency comb 22' is then received (step S3$_a$) and converted to the electrical frequency comb 20 (step S4$_a$) via the light receiving unit 14. The result of step S4$_a$, e.g., the electrical frequency comb 20, is characterized by a small spacing between the individual Dirac functions in the frequency domain and by a high signal-to-noise ratio.

Figure 2:
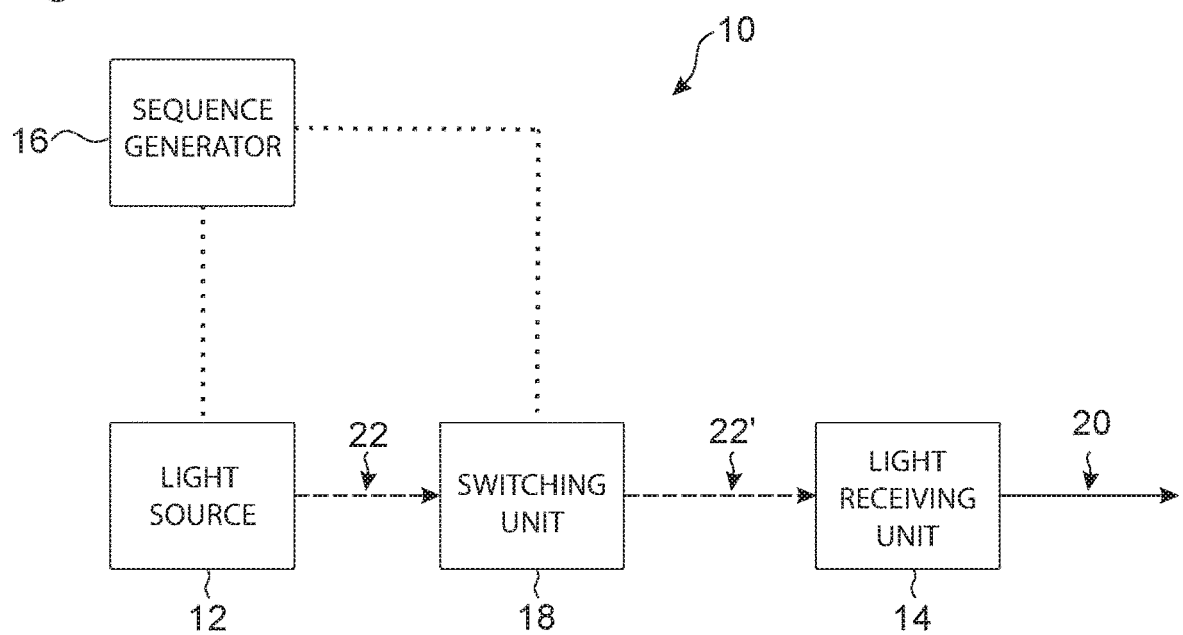
FIG. 2 schematically shows a second representative embodiment of a frequency comb generating device according to the disclosure.

In the embodiment shown in FIG. 2, the switching unit 18 is an optical switch that is connected to the pulsed optical light source 12 and to the light receiving unit 14. The switching unit 18 is positioned downstream of the pulsed optical light source 12 and upstream of the light receiving unit 14. Put it another way, the switching unit 18 is positioned between the pulsed optical light source 12 and the light receiving unit 14.

Figure 6:
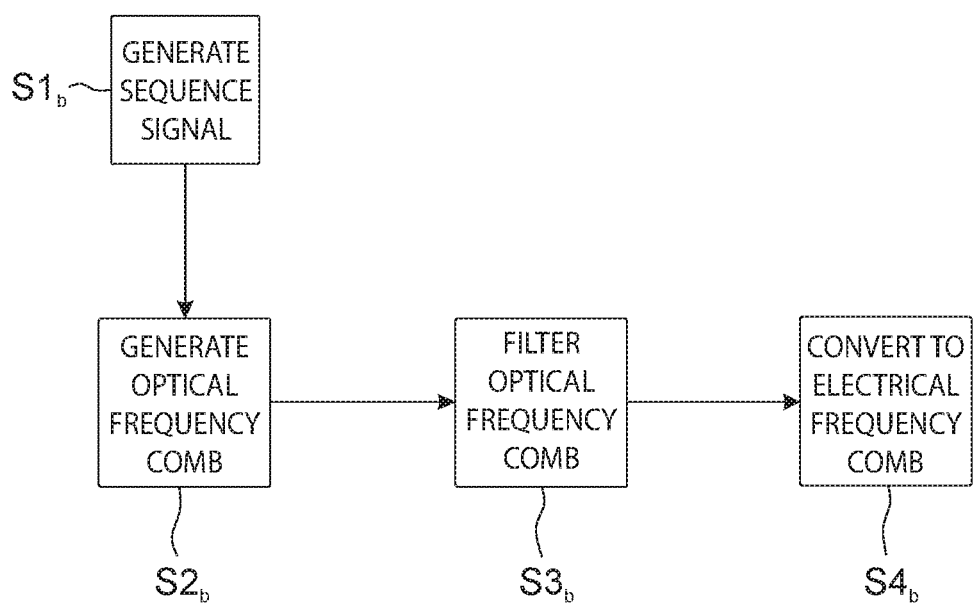
FIG. 6 schematically shows a flowchart of a second representative embodiment of a method for generating an electrical frequency comb according to the disclosure.

The switching unit 18 is configured to attenuate and/or phase shift the optical pulses, also called electromagnetic wave packets, generated by the pulsed optical light source 12 based on the current value of the repeating sequence signal. In this embodiment, an electrical frequency comb 20 with known characteristics is generated as explained in the following with reference to FIGS. 2 and 6.

First, the repeating sequence signal is generated via the sequence generator as described above (step S1$_b$). Moreover, optical pulses are generated via the optical light source 12 at a frequency $f_p$ (step S2$_b$), which results in an optical frequency comb 22 with a spacing of $f_p$ of the individual Dirac functions in the frequency domain. The switching unit 18 filters the optical frequency comb 22 based on the current value of the repeating frequency signal (step S3$_b$).

More precisely, the switching unit 18 attenuates and/or phase shifts an optical pulse passing the switching unit 18 every time the current piece of information contained in the repeating sequence signal is equal to at least one of the possible values and does not alter the optical pulse when the current piece of information contained in the repeating sequence signal is equal to one of the other possible values.

For example, if the repeating sequence is a binary sequence, the possible individual pieces of information will be "0" and "1". In this case, the switching unit 18 may alter the optical pulse for every "1" and may not alter the optical pulse for every "0" in the binary sequence, or vice versa.

In one particular example, the switching unit 18 completely filters out some of the optical pulses based on the respective value of the repeating sequence signal.

The result of step S3$_b$ is a modified optical frequency comb 22' that is equivalent to the one described above in the context of the first possible embodiment. Thus, the remaining steps are the same, namely receiving the modified optical frequency comb 22' (step S3$_b$) and converting it to the electrical frequency comb 20 (step S4) via the light receiving unit 14.

Figure 3:
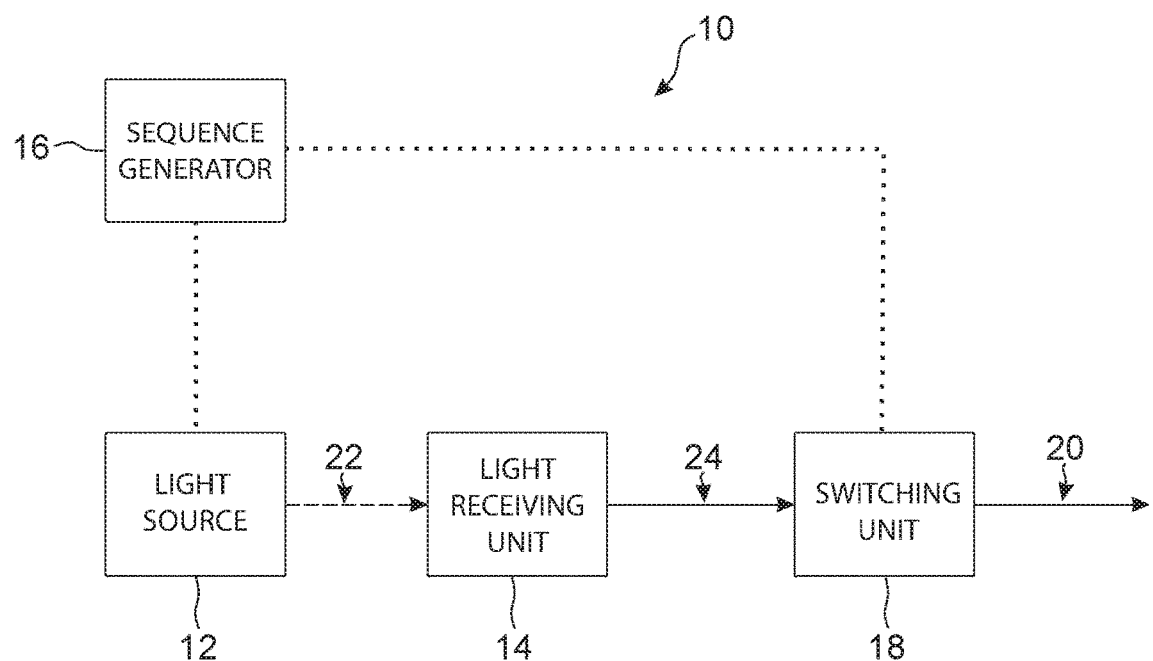
FIG. 3 schematically shows a third representative embodiment of a frequency comb generating device according to the disclosure.

In the embodiment shown in FIG. 3, the switching unit 18 is an electrical switch that is connected to the light receiving unit 14 wherein the switching unit 18 is located downstream of the light receiving unit 14. Therefore, electrical signals generated by the light receiving unit 14 are forwarded to the switching unit 18.

Figure 7:
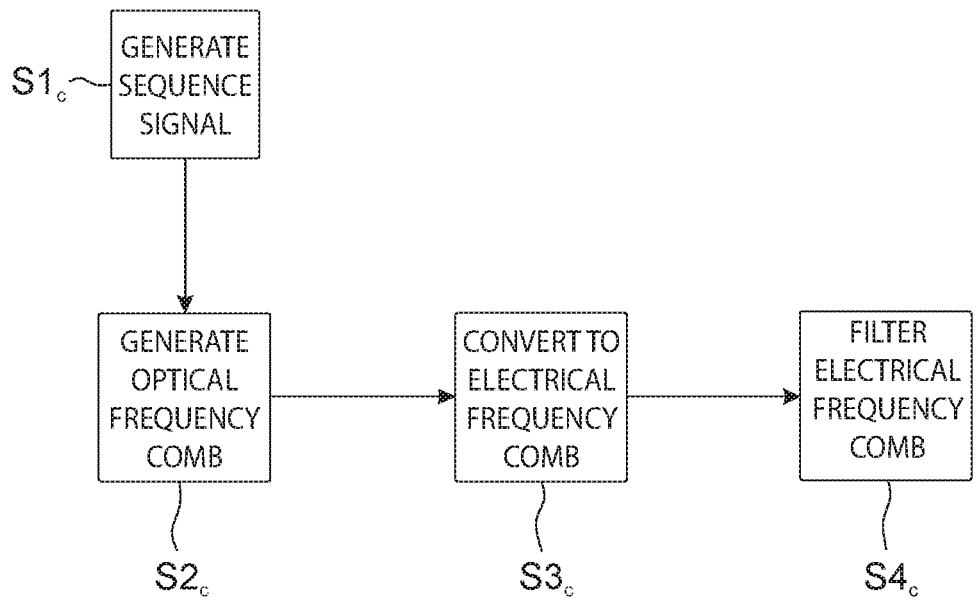
FIG. 7 schematically shows a flowchart of a third representative embodiment of a method for generating an electrical frequency comb according to the disclosure.

The switching unit 18 is configured to attenuate and/or phase shift the electrical pulses generated by the light receiving unit 14 based on the current value of the repeating sequence signal. In this embodiment, an electrical frequency comb 20 with known characteristics is generated as explained in the following with reference to FIGS. 3 and 7.

First, the repeating sequence signal is generated via the sequence generator as described above (step S1$_c$). Moreover, optical pulses are generated via the optical light source 12 at a frequency $f_p$ (step S2$_c$), which results in an optical frequency comb 22 with a spacing of $f_p$ of the individual Dirac functions in the frequency domain. The optical frequency comb 22 is converted to a corresponding intermediate electrical frequency comb 24 by the light receiving unit 14 (step S3$_c$). The switching unit 18 filters the intermediate electrical frequency comb 24 based on the current value of the repeating frequency signal (step S4$_c$).

More precisely, the switching unit 18 attenuates and/or phase shifts an electrical pulse passing the switching unit 18 every time the current piece of information contained in the repeating sequence signal is equal to at least one of the possible values and does not alter the electrical pulse when the current piece of information contained in the repeating sequence signal is equal to one of the other possible values.

For example, if the repeating sequence is a binary sequence, the possible individual pieces of information will be "0" and "1". In this case, the switching unit 18 may alter the electrical pulse for every "1" and may not alter the optical pulse for every "0" in the binary sequence, or vice versa.

In one particular example, the switching unit 18 completely filters out some of the electrical pulses based on the respective value of the repeating sequence signal.

The result of step S4$_c$ is the electrical frequency comb 20 that is equivalent to the one described in the context of the first embodiment.

Figure 4:
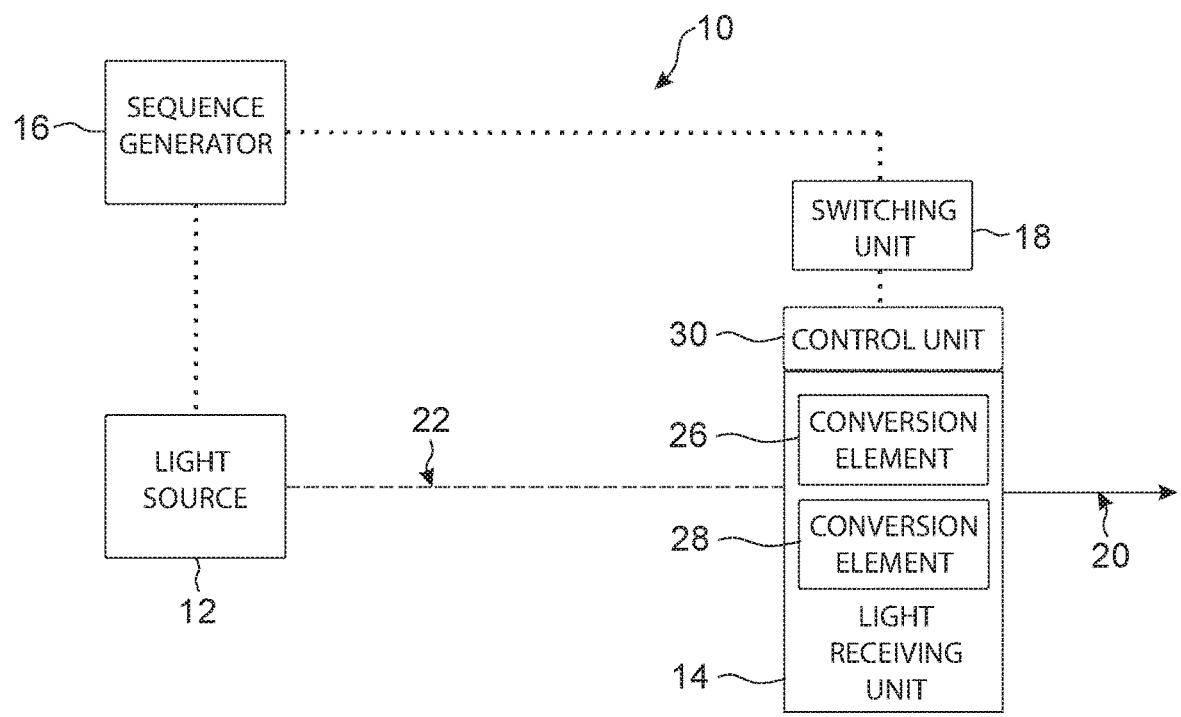
FIG. 4 schematically shows a fourth representative embodiment of a frequency comb generating device according to the disclosure.

In the embodiment shown in FIG. 4, the switching unit 18 is configured to control the light receiving unit 14 based on the repeating sequence signal, more specifically based on the current value of the repeating sequence signal. The switching unit 18 may be separate from the sequence generator 16 and the light receiving unit 14. Alternatively, the switching unit 18 may be integrated into the sequence generator 16 or into the light receiving unit 14.

Figure 8:
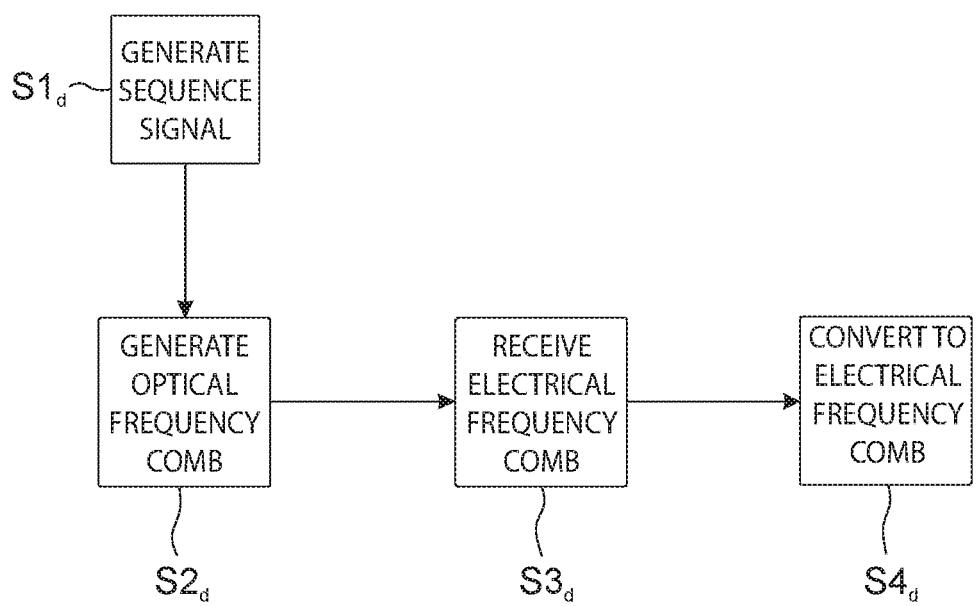
FIG. 8 schematically shows a flowchart of a fourth representative embodiment of a method for generating an electrical frequency comb according to the disclosure.

In this embodiment, an electrical frequency comb 20 with known characteristics is generated as explained in the following with reference to FIGS. 4 and 8. First, the repeating sequence signal is generated via the sequence generator 16 as described above (step S1$_d$). Moreover, optical pulses are generated via the optical light source 12 at a frequency $f_p$ (step S2$_d$), which results in an optical frequency comb 22 with a spacing of $f_p$ of the individual Dirac functions in the frequency domain. The optical pulses are then received via the light receiving unit 14 (step S3$_d$), wherein the light receiving unit 14 is controlled by the switching unit 18 to convert each of the received optical pulses into a corresponding electrical pulse with predefined properties (step S4$_d$), thereby generating the electrical frequency comb 20. In step S4$_d$, the predefined properties of each electrical pulse depend on the current value of the repeating sequence signal.

More precisely, the light receiving unit 14 generates an electrical pulse every time the current piece of information contained in the repeating sequence signal is equal to at least one of the possible values and does not generate an electrical pulse when the current piece of information contained in the repeating sequence signal is equal to one of the other possible values.

For example, if the repeating sequence is a binary sequence, the possible individual pieces of information will be "0" and "1". In this case, the light receiving unit 14 may generate an electrical pulse for every "1" and may not generate an electrical pulse for every "0" in the binary sequence, or vice versa.

In another example, if the repeating sequence is a ternary sequence, the individual pieces of information will be "−1", "0" and "1", or at least the actual values can be mapped to these three values.

In this case, the light receiving unit 14 may generate a positive voltage electrical pulse for every "1", a negative voltage electrical pulse for every "−1" and may not generate an electrical pulse for every "0" in the ternary sequence. Of course, any other mapping of current values of the repeating sequence signal onto the properties of the electrical pulses is also possible.

In order to generate the positive and negative voltage electrical pulses, the light receiving unit 14 may comprise, for example, a first conversion element 26 being configured to generate positive voltage electrical pulses and a second conversion element 28 being configured to generate negative voltage electrical pulses. The switching unit 18 may be configured to selectively activate one of the two conversion elements 26, 28 based on the current value of the ternary sequence.

Alternatively, the light receiving unit 14 may comprise, for example, a control unit 30 being configured to selectively activate the conversion elements 26, 28 based on a corresponding control signal received from the switching unit 18.

As described above, the switching unit 18 may be assigned to different components of the frequency comb generating device 10 that comprise an optical part and an electrical part which are separated by the light receiving unit 14.

Hence, the representative embodiments shown in FIGS. 1 and 2 illustrate that the switching unit 18 is assigned to the optical part of the frequency comb generating device 10 whereas the switching unit 18 is assigned to the electrical part of the frequency comb generating device 10 in the representative embodiment shown in FIG. 3.

The representative embodiment according to FIG. 4 illustrates that the switching unit 18 is assigned to the light receiving unit 14 itself while controlling the light receiving unit 14. Thus, the converting properties may be controlled via the switching unit 18.

Parts of the frequency comb generating device 10 as shown in FIGS. 1 and 2, for example the pulsed optical light source 12, the sequence generator 16 and the switching unit 18, may also be used to only generate the modified optical frequency comb 22', e.g., conversion of the modified optical frequency comb 22' into the electrical frequency comb 20 may be omitted.

This can be achieved by only performing the steps S1$_a$ and S2$_a$ as explained above with reference to FIGS. 1 and 5 or by only performing the steps S1$_b$, S2$_b$ and S3$_b$ as explained above with reference to FIGS. 2 and 6.

The resulting modified optical frequency comb 22' in time domain is missing some of its teeth compared to a full optical frequency comb, which translates to a shorter distance between the individual Dirac functions in frequency domain. Thus, by cancelling out some of the Dirac functions in time domain (or rather not generating them in the first place), a fine modified optical frequency comb 22' is achieved.

The modified optical frequency comb 22' may then be forwarded to further devices, e.g. for the purpose of calibrating the devices.

One or more components of the present disclosure, such as the control unit 30, may include, in some embodiments, logic for implementing the technologies and methodologies described herein. This logic can be carried out in either hardware or software, or a combination of hardware and software. In some embodiments, the control unit 30 includes one or more computing devices such as a processor (e.g., a microprocessor), a central processing unit (CPU), a digital signal processor (DSP), an application-specific integrated circuit (ASIC), a field-programmable gate array (FPGA), digital logic circuits, or the like, or any combinations thereof, and can include discrete digital or analog circuit elements or electronics, or combinations thereof.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from The embodiments of the invention in which an exclusive property or privilege is claimed are defined as follows:

1. A frequency comb generating device comprising
a pulsed optical light source, a sequence generator, a light receiving unit and a switching unit;
the sequence generator being configured to generate a repeating sequence signal and to forward the repeating sequence signal at least to the switching unit;
the pulsed optical light source being configured to generate electromagnetic wave packets, and the pulsed optical light source being synchronized with the sequence generator;
the light receiving unit being configured to receive the electromagnetic wave packets, and the light receiving unit being configured to convert the electromagnetic wave packets into an electrical signal;
the switching unit being configured to at least one of control the pulsed optical light source, control the light receiving unit, attenuate the electromagnetic wave packets, phase shift the electromagnetic wave packets, attenuate the electrical signal, or phase shift the electrical signal based on the repeating sequence signal; and
said pulsed optical light source, said sequence generator, said light receiving unit and said switching unit together establishing said frequency comb generating device.

2. The frequency comb generating device of claim 1, wherein the sequence generator is configured to generate a pseudorandom binary sequence.

3. The frequency comb generating device according to claim 2, wherein the switching unit is configured to control the pulsed optical light source to generate an electromagnetic wave packet for each bit of the binary sequence having one value of the two possible values and to not generate an electromagnetic wave packet for each bit having the other value of the two possible values.

4. The frequency comb generating device of claim 1, wherein the light receiving unit is a photo diode.

5. The frequency comb generating device of claim 1, wherein the pulsed optical light source is an optical pulsed laser.

6. The frequency comb generating device of claim 1, wherein the pulsed optical light source and the light receiving unit are optically connected with each other via an optical fiber.

7. The frequency comb generating device of claim 1, wherein the switching unit is configured to control the pulsed optical light source to generate an electromagnetic wave packet for at least one certain current value of the repeating sequence signal and to not generate an electromagnetic wave packet for at least one other certain current value of the repeating sequence signal.

8. The frequency comb generating device according to claim 7, wherein the switching unit is configured to control the pulsed optical light source to generate an electromagnetic wave packet for each bit of the binary sequence having one value of the two possible values and to not generate an electromagnetic wave packet for each bit having the other value of the two possible values.

9. The frequency comb generating device of claim 1, wherein the switching unit is an electrical switch connected to the light receiving unit, the switching unit being positioned downstream of the light receiving unit.

10. The frequency comb generating device of claim 1, wherein the switching unit is an optical switch connected to the light receiving unit, the switching unit being positioned upstream of the light receiving unit.

11. The frequency comb generating device of claim 1, wherein the switching unit is configured to control the light receiving unit to convert the received electromagnetic wave packets into an electrical signal with predefined properties, wherein the predefined properties depend on the current value of the repeating sequence signal.

12. The frequency comb generating device of claim 11, wherein the repeating sequence signal comprises a ternary sequence.

13. The frequency comb generating device of claim 12, wherein the switching unit is configured to control the light receiving unit to generate a positive voltage pulse, a negative voltage pulse or no voltage pulse based on the current value of the ternary sequence.

14. The frequency comb generating device of claim 13, wherein the light receiving unit is a switchable photo diode comprising two conversion elements, wherein the switching unit is configured to selectively activate the conversion elements based on the current value of the ternary sequence.

15. The frequency comb generating device of claim 13, wherein the light receiving unit includes a switchable photo diode comprising two conversion elements and a control unit, wherein the switching unit is configured to forward the repeating sequence signal to the control unit, and wherein the control unit is configured to selectively activate the two conversion elements based on the repeating sequence signal.

16. The frequency comb generating device of claim 1, wherein the sequence generator, the light receiving unit, the switching unit and a control unit are placed on a same chip or die.

17. A frequency comb generating device comprising:
a pulsed optical light source, a sequence generator, a light receiving unit and a switching unit;
the sequence generator being configured to generate a repeating sequence signal and to forward the repeating sequence signal at least to the switching unit;
the pulsed optical light source being configured to generate electromagnetic wave packets, and the pulsed optical light source being synchronized with the sequence generator;
the light receiving unit being configured to receive the electromagnetic wave packets, and the light receiving unit being configured to convert the electromagnetic wave packets into an electrical signal; and
the switching unit being configured to at least one of control the pulsed optical light source, control the light receiving unit, attenuate the electromagnetic wave packets, phase shift the electromagnetic wave packets, attenuate the electrical signal, or phase shift the electrical signal based on the repeating sequence signal,
wherein the switching unit is configured to control the light receiving unit to convert the received electromagnetic wave packets into an electrical signal with predefined properties, wherein the predefined properties depend on the current value of the repeating sequence signal.

18. A frequency comb generating device comprising:
a pulsed optical light source, a sequence generator, a light receiving unit and a switching unit;

the sequence generator being configured to generate a repeating sequence signal and to forward the repeating sequence signal at least to the switching unit;

the pulsed optical light source being configured to generate electromagnetic wave packets, and the pulsed optical light source being synchronized with the sequence generator;

the light receiving unit being configured to receive the electromagnetic wave packets, and the light receiving unit being configured to convert the electromagnetic wave packets into an electrical signal; and the switching unit being configured to at least one of control the pulsed optical light source, control the light receiving unit, attenuate the electromagnetic wave packets, phase shift the electromagnetic wave packets, attenuate the electrical signal, or phase shift the electrical signal based on the repeating sequence signal, wherein the switching unit is configured to alter properties of an electrical frequency comb generated by the frequency comb generating device.

* * * * *